(12) United States Patent
Zhang et al.

(10) Patent No.: US 7,746,094 B2
(45) Date of Patent: Jun. 29, 2010

(54) TESTING SYSTEM FOR POWER SUPPLY

(75) Inventors: Xin-Ping Zhang, Shenzhen (CN);
Gui-Feng Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 500 days.

(21) Appl. No.: 11/838,245

(22) Filed: Aug. 14, 2007

(65) Prior Publication Data

US 2008/0314168 A1 Dec. 25, 2008

(30) Foreign Application Priority Data

Jun. 20, 2007 (CN) .......................... 2007 1 0200844

(51) Int. Cl.
*G01R 31/36* (2006.01)
(52) U.S. Cl. ...................................... 324/771
(58) Field of Classification Search ................. 324/73.1, 324/649, 439, 434, 765, 158.1, 771, 522, 324/120; 327/110, 427, 437
See application file for complete search history.

(56) References Cited

U.S. PATENT DOCUMENTS 7,362,148 B2 * 4/2008 Okitsu ........................ 327/110
7,609,081 B2 * 10/2009 Wong et al. .................. 324/765

* cited by examiner

*Primary Examiner*—Minh N Tang
*Assistant Examiner*—Trung Q Nguyen
(74) *Attorney, Agent, or Firm*—Frank R. Niranjan

(57) ABSTRACT

A testing system for a power supply (40) includes a testing chamber (10), a control switch, an electrical load (50), an AC source (60), and a PLC (30). The power supply has a voltage choice switch. The testing chamber receives the power supply therein. The testing chamber provides a first or a second ambient temperature and supplies a testing environment for the power supply. The control switch switches the power supply to operate between a standby state and an operational state. The electrical load is connected to the power supply. The AC source is connected to the power supply. The AC source outputs the first voltage or the second voltage to the power supply. The PLC controls switching states of the voltage choice switch and the control switch in a manner such that the power supply selectively operates in one of combined switching states of the voltage choice switch and the control switch.

19 Claims, 4 Drawing Sheets

TESTING SYSTEM FOR POWER SUPPLY

BACKGROUND

1. Field of the Invention

The present invention relates to testing systems, and more particularly to a temperature testing system for a power supply.

2. Description of Related Art

A power supply is very important in a computer for supplying power to each part of the computer and ensuring normal running of the parts in the computer. If the power supply does not function properly, the computer will not run normally. Therefore, the working parameters of the power supply need to be tested during design, manufacture, and testing of the computer.

In a temperature testing system for a power supply, it is common to test under a variety of conditions to ensure ability of the power supply to operate properly in different working states. It usually takes twelve hours to test a power supply in the temperature testing system, and testing conditions need to be manually changed every two hours. This process is very complex for the testing operators, and adds to the time and cost of testing.

What is needed, therefore, is a temperature testing system for a power supply with the testing conditions being changed automatically.

SUMMARY

A testing system for testing a temperature of a power supply includes a testing chamber, a control switch, an electrical load, an AC source, and a PLC. The power supply has a voltage choice switch for switching the power supply to operate at a first voltage or a second voltage. The testing chamber is configured for receiving the power supply therein. The testing chamber is configured for selectively providing a first or a second ambient temperature and supplying a testing environment for the power supply. The control switch is configured for switching the power supply to operate between a standby state and an operational state. The electrical load electrically is connected to the power supply, for functioning as a testing load for the power supply. The AC source is electrically connected to the power supply. The AC source is configured for outputting the first voltage or the second voltage to the power supply. The PLC is configured for controlling switching states of the voltage choice switch and the control switch in a manner such that the power supply selectively operates in one of combined switching states of the voltage choice switch and the control switch.

Other advantages and novel features of the present invention will become more apparent from the following detailed description of a preferred embodiment when taken in conjunction with the accompanying drawings, in which:

DETAILED DESCRIPTION

Figure 1:
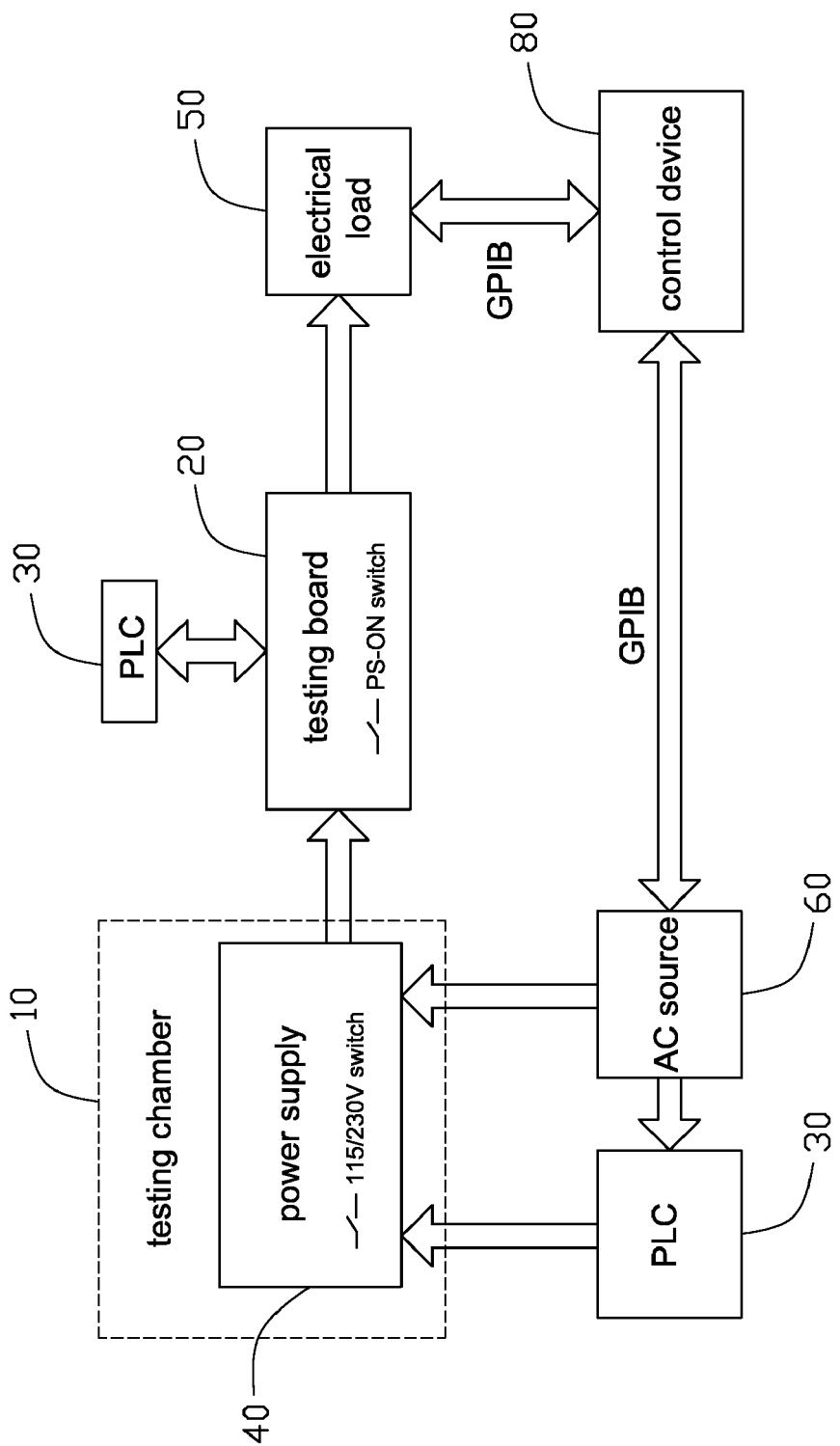
FIG. 1 is a configuration diagram of a testing system for a power supply in accordance with a preferred embodiment of the present invention.

Referring to FIG. 1, a temperature testing system for a power supply 40 of an embodiment of the present invention is shown. The power supply 40 may be used in for example a computer. The temperature testing system includes a testing chamber 10 for receiving the power supply 40, a testing board 20, an electrical load 50, an Alternating Current (AC) source 60, a control device 80 connected to the electrical load 50 and the AC source 60 respectively, and a Programmable Logic Controller (PLC) 30.

The power supply 40 is connected to the AC source 60 for receiving an input voltage from the AC source 60. The power supply 40 is also connected to the electrical load 50 via the testing board 20. A voltage choice (115/230V) switch is mounted on the power supply 40. In this embodiment, when the 115/230V switch is closed, the input voltage of the power supply 40 from the AC source 60 is 115V; when the 115/230V switch is open, the input voltage of the power supply 40 from the AC source 60 is 230V. The testing chamber 10 is used for simulating a working environment of the power supply 40, and can be switched between two different states: a low temperature state when a computer is in standby condition, and a high temperature state when a computer is running. A signal control switch (PS-ON switch) for controlling a PS-ON (Power Supply-On) signal from the power supply 40 is mounted on the testing board 20. When the PS-ON switch is closed, the power supply 40 is running; when the PS-ON switch is open, the power supply 40 is on standby. The electrical load 50 is a testing device for testing voltage, current and so on of power supplies. The electrical load 50 includes a plurality of input interfaces, and can simulate a load to the power supply 40 for testing. In this embodiment, the electrical load 50 includes three loads: a standby load, a first full load, and a second full load; the control device 80 is a CHROMA 8200 device. The control device 80 communicates with the electrical load 50 and the AC source 60 via the General-Purpose Interface Bus (GPIB) for automatically controlling changing among the three loads and automatically controlling the input voltage output by the AC source 60 to switch between 230V and 115V. The PLC 30 is connected to the power supply 40, the AC source 60, and the testing board 20, for detecting whether the power supply 40 is operating normally and automatically controlling openings or closings of the 115/230V switch and the PS-ON switch.

Figure 2:
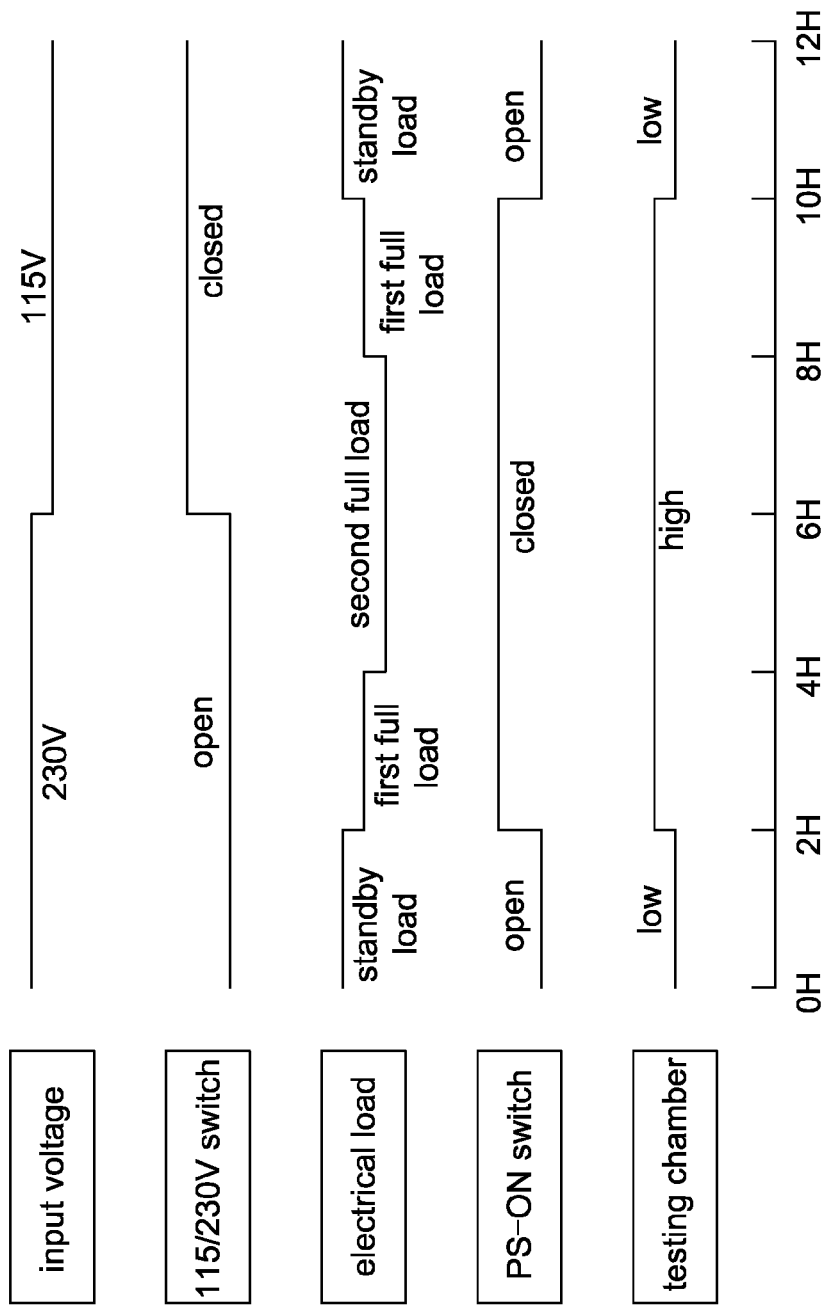
FIG. 2 is a chart depicting a timeline of the changing testing conditions in the testing system.

Referring to FIG. 2, a timing chart of the changing testing conditions in the testing system is shown. In the temperature testing system for the power supply 40, it usually takes twelve hours (12 H) to complete, and some of the testing conditions need to be changed every two hours. From 0 H~2 H, the input voltage of the power supply 40 output by the AC source 60 is 230V, the 115/230V switch is open, the electrical load 50 is set to standby load, the PS-ON switch is open, and the testing chamber 10 is in the low temperature state. From 2 H~4 H, the electrical load 50 is set to first full load, the PS-ON switch is closed, the testing chamber 10 is in the high temperature state, and other testing conditions remain the same. From 4 H~6 H, the electrical load 50 is set to second full load, and other testing conditions remain the same as from 2 H~4 H. From 6 H~8 H, the input voltage of the power supply 40 is set to 115V, the 115/230V switch is closed, and other testing conditions remain the same as from 4 H~6 H. From 8 H~10 H, the electrical load 50 is set to first full load, and other testing conditions remain the same as from 6 H~8 H. From 10 H~12 H, the electrical load 50 is set to standby load, the PS-ON switch is open, the testing chamber 10 is in the low temperature state, and other testing conditions remain the same as from 8 H~10 H. The temperature data of the power supply 40 and the components therein are stored in a data base accessible by testing operators at the end of each two hour testing period.

Figure 3:
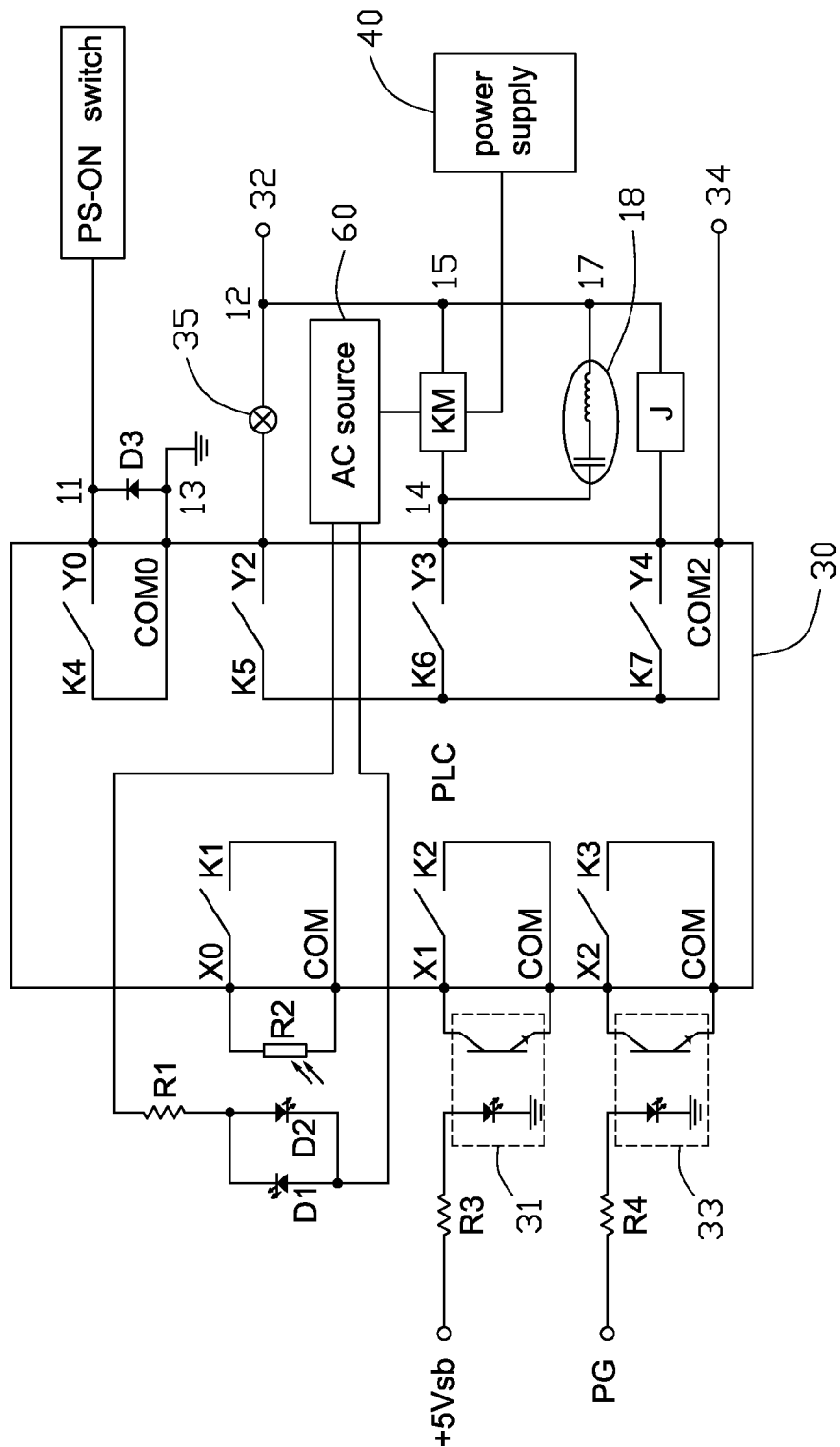
FIG. 3 is a wiring diagram of a PLC in the testing system.

Referring to FIG. 3, a wiring diagram of the PLC 30 in the testing system is shown. Two output terminals of the AC source 60 are connected to the input terminal of the power supply 40 through a switch KM. The two output terminals of the AC source 60 are connected to each other through a resistor R1 and two light emitting diodes (LEDs) D1, D2 connected in parallel. The LEDs D1, D2 are positioned adjacent to each other. A photoresistor R2 for sensing light is positioned adjacent the LEDs D1, D2. Two terminals of the resistor R2 are respectively connected to the input terminals X0 and COM of the PLC 30. A switch K1 is connected between the input terminals X0 and COM of the PLC 30. A +5 Vsb (stand by) assistant voltage signal output by the power supply 40 is connected to the input terminals X1 and COM of the PLC 30 through a resistor R3 and a photoelectric coupler 31. A switch K2 is connected between the input terminals X1 and COM of the PLC 30. A PG (Power Good) power voltage signal output by the power supply 40 is connected to the input terminals X2 and COM of the PLC 30 through a resistor R4 and a photoelectric coupler 33. A switch K3 is connected between the input terminals X0 and COM of the PLC 30. A switch K4 is connected between the output terminals Y0 and COM0 of the PLC 30. The output terminal Y0 is connected to the PS-ON switch via a node 11. The output terminal COM0 is connected to ground via a node 13. A diode D3 is connected between the nodes 11 and 13. The output terminals Y2, Y3, and Y4 of the PLC 30 are respectively connected to the switches K5, K6, and K7. The switches K5, K6, and K7 are also connected to an output terminal COM2 of the PLC 30. The output terminal Y2 is also connected to a terminal 32 through a lamp 35 and a node 12. The output terminal Y3 is connected to the node 12 through a node 14, and a node 15, and the node 14 is also connected to the node 15 through an LC module 18, and a node 17. The switch KM is also connected between the node 14 and the node 15. The output terminal Y4 is connected to the node 17 through a relay J. The output terminal COM2 is also connected to a terminal 34. A voltage from the AC source is inputted across the terminals 32 and 34. When the LEDs D1 or D2 emit light, the switch K1 will be closed under the control of the photoresistor R2. When the +5 Vsb assistant voltage signal is input normally, the switch K2 will be closed under the control of the photoelectric coupler 31. When the PG signal is input normally, the switch K3 will be closed under the control of the photoelectric coupler 33. The switch K4 is used for controlling opening or closing of the PS-ON switch. The switches K5 and K6 remain closed when the power supply 40 operates normally. The switch K7 controls opening or closing of the relay J to realize opening or closing of the 115/230V switch.

Figure 4:
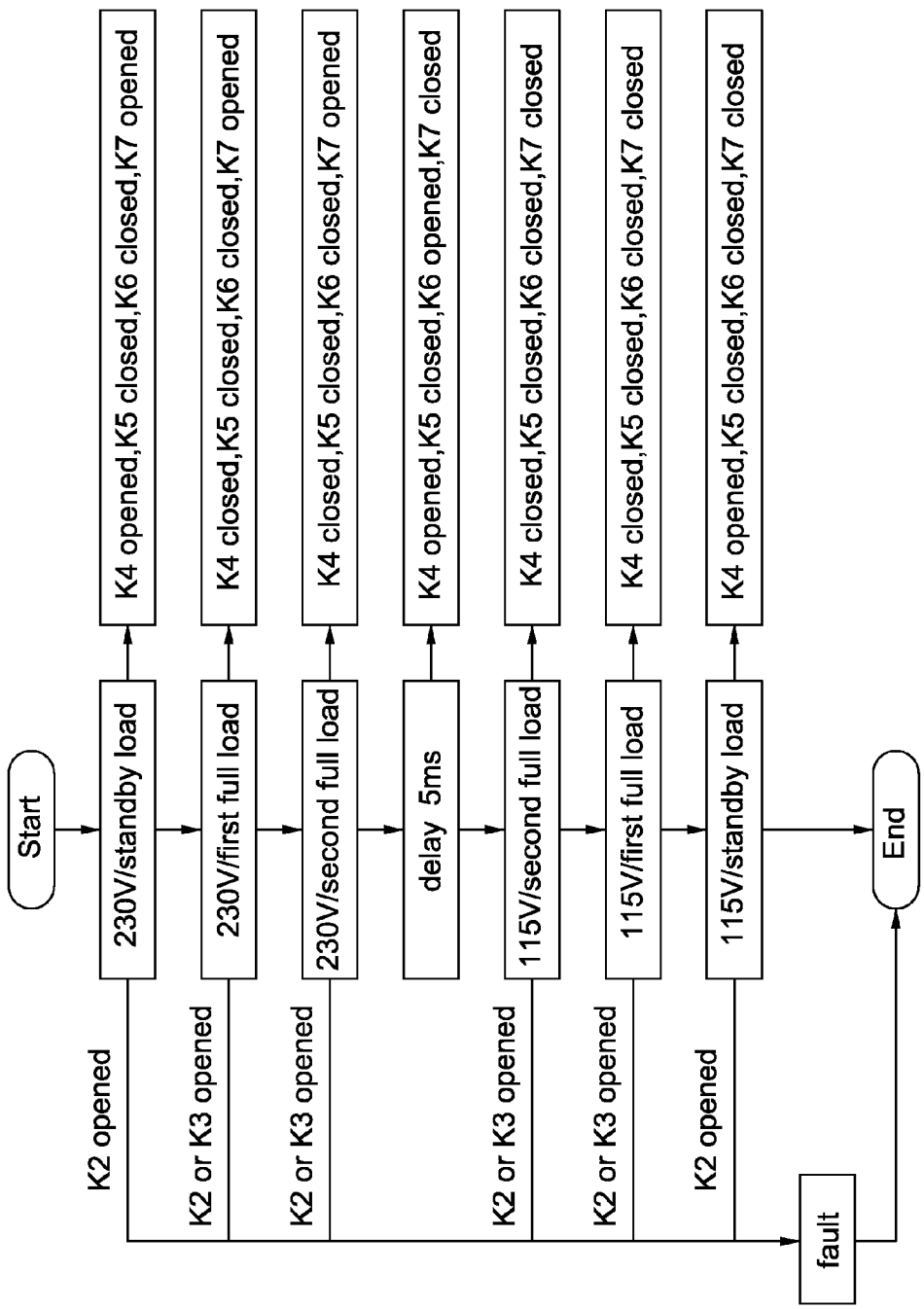
FIG. 4 is a working flow chart of the PLC in the testing system.

Referring to FIG. 4, a working flow chart of the PLC 30 in the testing system is shown. If the PLC 30 detects that the input voltage to the power supply 40 is 230V and the electrical load 50 is on the standby load, the switch K4 will be opened, the switch K5 will be closed, the switch K6 will be closed, and the switch K7 will be opened under the control of the PLC 30. If the switch K2 opens at this time, the testing will stop and the testing operators will check fault of the testing system, if the switch K5 or K6 is opened, a fault will be indicated in the power supply 40.

If the PLC 30 detects that the input voltage to the power supply 40 is 230V and the electrical load 50 changes to the first full load, the switch K4 will be closed, the switch K5 will be closed, the switch K6 will be closed, and the switch K7 will be opened under the control of the PLC 30. If the switch K2 or K3 opens, the testing will stop and the testing operators will check fault of the testing system, if the switch K5 or K6 is opened, a fault will be indicated in the power supply 40.

If the PLC 30 detects that the input voltage to the power supply 40 is 230V and the electrical load 50 changes to the second full load, the switch K4 will be closed, the switch K5 will be closed, the switch K6 will be closed, and the switch K7 will be opened under the control of the PLC 30. If the switch K2 or K3 opens, the testing will stop and the testing operators will check fault of the testing system, if the switch K5 or K6 is opened, a fault will be indicated in the power supply 40.

In this embodiment, it usually takes 5 ms delay when the input voltage to the power supply 40 changes from 230V to 115V, and then the switch K4 will be opened, the switch K5 will be closed, the switch K6 will be opened, and the switch K7 will be closed under the control of the PLC 30. In this delay time, the testing will not stop and the testing operators know that it is only a testing process.

If the PLC 30 detects that the input voltage of the power supply 40 changes to 115V and the electrical load 50 is on the second full load, the switch K4 will be closed, the switch K5 will be closed, the switch K6 will be closed, and the switch K7 will be closed under the control of the PLC 30. If the switch K2 or K3 opens, the testing will stop and the testing operators will check fault of the testing system, if the switch K5 or K6 is opened, a fault will be indicated in the power supply 40.

If the PLC 30 detects that the input voltage of the power supply 40 is 115V and the electrical load 50 changes to the first full load, the switch K4 will be closed, the switch K5 will be closed, the switch K6 will be closed, and the switch K7 will be closed under the control of the PLC 30. If the switch K2 or K3 opens, the testing will stop and the testing operators will check fault of the testing system, if the switch K5 or K6 is opened, a fault will be indicated in the power supply 40.

If the PLC 30 detects that the input voltage of the power supply 40 is 115V and the electrical load 50 changes to the standby load, the switch K4 will be opened, the switch K5 will be closed, the switch K6 will be closed and the switch K7 will be closed under the control of the PLC 30. If the switch K2 is opens, the testing will stop and the testing operators will check fault of the testing system, if the switch K5 or K6 is opened, a fault will be indicated in the power supply 40. When the testing is finished, the testing operators can find and register the testing data in the data base.

Therefore, in the temperature testing system for the power supply 40, it is needless to change the testing conditions manually: the input voltage from the AC source 60 and the state of the electrical load 50 will be changed through controlling of the control device 80; the openings or closings of the 115/230V switch and the PS-ON switch will be under the control of the PLC 30; and the temperature of the testing chamber 10 will be changed automatically.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A testing system for testing a temperature of a power supply, the power supply having a voltage choice switch for switching the power supply to operate at a first voltage or a second voltage, the testing system comprising:

a testing chamber for receiving the power supply therein, the testing chamber being configured for selectively providing a first or a second ambient temperature and supplying a testing environment for the power supply;

a control switch for switching the power supply to operate between a standby state and an operational state;

an electrical load electrically connected to the power supply, for functioning as a testing load for the power supply;

an AC source electrically connected to the power supply, the AC source being configured for outputting the first voltage or the second voltage to the power supply; and a PLC configured for controlling switching states of the voltage choice switch and the control switch in a manner such that the power supply selectively operates in one of combined switching states of the voltage choice switch and the control switch.

2. The testing system as described in claim 1, wherein the electrical load is variable between a lower load and a higher load.

3. The testing system as described in claim 2, further comprising a control device, wherein the control device is configured for programmatically controlling the AC source to output the first voltage or the second voltage to the power supply and controlling the electrical load to selectively operate at the lower load or the higher load.

4. The testing system as described in claim 3, wherein the control device is connected to the AC source and the electrical load via the general-purpose interface bus.

5. The testing system as described in claim 1, wherein the first and second voltages are respectively 230V and 115V.

6. The testing system as described in claim 5, wherein the PLC is configured for controlling the switching states of voltage choice switch so as to cause the power supply to operate at the first voltage of 230V and the standby state when the output voltage from the AC source is 230V and the electrical load operates at the lower load.

7. The testing system as described in claim 6, wherein the PLC is configured for controlling the control switch so as to cause the power supply to operate at the operational state when the electrical load operates at the higher load.

8. The testing system as described in claim 5, wherein the PLC is configured for controlling the switching states of the voltage choice switch and the control switch so as to cause the power supply to operate at the second voltage of 115V and the operational state when the output voltage from the AC source is 115V and the electrical load operates at the higher load.

9. The testing system as described in claim 8, wherein the PLC is configured for controlling the control switch so as to cause the power supply to operate at the operational state when the electrical load operates at the lower load.

10. The testing system as described in claim 1, wherein the testing chamber is configured for providing the first ambient temperature when the power supply operates at the standby state or the second ambient temperature when the power supply operates at the operational state.

11. A temperature testing system for a power supply mounting a voltage choice switch thereon, comprising:

a control switch for switching the power supply to operate between a standby state and an operational state;

an AC source electrically connected to the power supply, the AC source being configured for outputting a first voltage or a second voltage to the power supply;

a PLC respectively connected to the control switch, the AC source and the power supply;

an electrical load electrically connected to the power supply, for functioning as a testing load for the power supply; and a control device connected to the electrical load and the AC source respectively;

wherein the control device controls the AC source to output the first voltage or the second voltage to the power supply and controls the electrical load to selectively operate at a lower load or a higher load, and the PLC controls switching states of the voltage choice switch and the control switch by detecting the voltage from the AC source and the state of the electrical load.

12. The testing system as described in claim 11, wherein the control device is connected to the AC source and the electrical load via the general-purpose interface bus.

13. The testing system as described in claim 11, wherein the testing system further comprises a testing chamber receiving the power supply for providing a first ambient temperature when the power supply operates at the standby state or a second ambient temperature when the power supply operates at the operational state.

14. The testing system as described in claim 11, wherein the power supply is connected to the electrical load through a testing board, the control switch mounted on the testing board.

15. The testing system as described in claim 11, wherein the first and second voltages are respectively 230V and 115V.

16. The testing system as described in claim 15, wherein the PLC is configured for controlling the switching states of voltage choice switch so as to cause the power supply to operate at the first voltage of 230V and the standby state when the output voltage from the AC source is 230V and the electrical load operates at the lower load.

17. The testing system as described in claim 16, wherein the PLC is configured for controlling the control switch so as to cause the power supply to operate at the operational state when the electrical load operates at the higher load.

18. The testing system as described in claim 15, wherein the PLC is configured for controlling the switching states of the voltage choice switch and the control switch so as to cause the power supply to operate at the second voltage of 115V and the operational state when the output voltage from the AC source is 115V and the electrical load operates at the higher load.

19. The testing system as described in claim 18, wherein the PLC is configured for controlling the control switch so as to cause the power supply to operate at the operational state when the electrical load operates at the lower load.

* * * * *